United States Patent
Yu et al.

(10) Patent No.: US 11,069,724 B2
(45) Date of Patent: Jul. 20, 2021

(54) ARRAY SUBSTRATE, MANUFACTURING METHOD THEREOF AND DISPLAY DEVICE USING THE SAME

(71) Applicant: Wuhan China Star Optoelectronics Semiconductor Display Technology Co., Ltd., Hubei (CN)

(72) Inventors: Lei Yu, Hubei (CN); Songshan Li, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 247 days.

(21) Appl. No.: 16/034,390

(22) Filed: Jul. 13, 2018

(65) Prior Publication Data
US 2019/0221591 A1    Jul. 18, 2019

Related U.S. Application Data

(63) Continuation of application No. PCT/CN2018/083357, filed on Apr. 17, 2018.

(30) Foreign Application Priority Data

Jan. 12, 2018  (CN) .......................... 201810033700.9

(51) Int. Cl.
*H01L 27/12*   (2006.01)
*H01L 21/30*   (2006.01)
*H01L 21/02*   (2006.01)

(52) U.S. Cl.
CPC .... *H01L 27/1274* (2013.01); *H01L 21/02532* (2013.01); *H01L 21/02675* (2013.01); *H01L 21/02686* (2013.01); *H01L 21/3003* (2013.01); *H01L 27/1222* (2013.01); *H01L 21/0262* (2013.01)

(58) Field of Classification Search
CPC ................................................ H01L 29/78675
See application file for complete search history.

(56) References Cited

U.S. PATENT DOCUMENTS

| 2005/0212986 A1* | 9/2005 | Kawasaki | ............. G02F 1/1362 |
| | | | 349/43 |
| 2006/0108914 A1* | 5/2006 | Young | ................. H01L 27/3244 |
| | | | 313/503 |

(Continued)

FOREIGN PATENT DOCUMENTS

| CN | 101866839 A | 10/2010 |
| CN | 104658898 A | 5/2015 |

(Continued)

*Primary Examiner* — Vongsavanh Sengdara

(57) ABSTRACT

The present disclosure relates to an array substrate, manufacturing method thereof and display device using the same. The method for manufacturing the array substrate includes: forming an amorphous silicon layer and an insulating layer covering the amorphous silicon layer in one deposition process; and processing the amorphous silicon layer to transform the amorphous silicon layer into a polysilicon layer. Through the above-mentioned method, the present disclosure can solve the problem of affecting the concentration of current carriers that caused by the oxidation of the surface of polysilicon, and improve the performance of the array substrate.

11 Claims, 11 Drawing Sheets

(56) References Cited

U.S. PATENT DOCUMENTS

| | | | |
|---|---|---|---|
| 2010/0025679 A1* | 2/2010 | Yamazaki | H01L 29/66969 257/43 |
| 2010/0117090 A1* | 5/2010 | Roh | H01L 27/1285 257/72 |
| 2014/0342101 A1* | 11/2014 | Peng | C23C 16/56 427/554 |
| 2016/0315197 A1 | 10/2016 | Liu et al. | |
| 2019/0259879 A1* | 8/2019 | He | H01L 29/66765 |

FOREIGN PATENT DOCUMENTS

| | | |
|---|---|---|
| CN | 105655404 A | 6/2016 |
| JP | 2005064453 A | 3/2005 |

* cited by examiner

US 11,069,724 B2

ARRAY SUBSTRATE, MANUFACTURING METHOD THEREOF AND DISPLAY DEVICE USING THE SAME

CROSS-REFERENCE TO RELATED APPLICATIONS

The present application is a continuation application of International (PCT) Patent Application No. PCT/CN2018/083357 filed on Apr. 17, 2018, which claims foreign priority of Chinese Patent Application No. 201810033700.9, filed on Jan. 12, 2018 in the State Intellectual Property Office of China, the entire contents of which are hereby incorporated by reference.

TECHNICAL FIELD

Embodiments of the present disclosure generally relate to the filed of display technology, and in particular relate to an array substrate, manufacturing method thereof and display device using the same.

BACKGROUND

An LTPS (low temperature poly-silicon) thin-film transistor (TFT) display uses an excimer laser as a heat source during the packaging process. After a laser light passes through a projection system, a laser beam with uniform energy distribution is generated and projected onto a glass substrate with amorphous silicon structure. After absorbing the energy of the excimer laser, the glass substrate with amorphous silicon structure will be transformed into glass substrate with polysilicon structure.

In the traditional LTPS production process, a-Si (amorphous silicon) is formed first, and then ELA (excimer laser anneal) is used to transform a-Si into p-Si (polysilicon) and perform patterning. After p-Si is formed, the surface of p-Si will be oxidized in the air, which will largely affect the performance of an LTPS-TFT.

SUMMARY

The technical problem mainly solved by the present disclosure is to provide an array substrate, manufacturing method thereof and display device using the same, which can solve the problem of affecting the concentration of current carriers that caused by the oxidation of the surface of polysilicon, and improve the performance of the array substrate.

To solve the above-mentioned technical problems, a technical solution adopted in the present disclosure is to provide a method for manufacturing a display device. The method comprises providing an array substrate comprising a polysilicon layer and insulating layer being disposed in a stacked manner; introducing a first mixed gas to deposit an amorphous silicon layer; introducing a second mixed gas to deposit the insulating layer on the amorphous silicon layer; dehydrogenating the amorphous silicon layer; and performing an excimer laser annealing process on the dehydrogenated amorphous silicon layer to transform the amorphous silicon layer into the polysilicon layer; wherein, an amorphous silicon layer and an insulating layer covering the amorphous silicon layer are formed by one deposition process.

To solve the above-mentioned technical problems, another technical solution adopted in the present disclosure is to provide a method for manufacturing an array substrate. The method includes: forming an amorphous silicon layer and an insulating layer covering the amorphous silicon layer in one deposition process; and processing the amorphous silicon layer to transform the amorphous silicon layer into a polysilicon layer.

The beneficial effects of the present disclosure are: different from the prior art, the method for manufacturing the array substrate provided by the present disclosure includes: forming an amorphous silicon layer and an insulating layer covering the amorphous silicon layer in one deposition process; and processing the amorphous silicon layer to transform the amorphous silicon layer into a polysilicon layer. By means of the above-mentioned methods, on the one hand, the problem that the polysilicon is exposed to air and oxidized after the amorphous silicon is transformed into the polysilicon is avoided, which solves the problem of affecting the concentration of current carriers that caused by the oxidation of the surface of polysilicon, and improves the performance of the array substrate. On the other hand, the amorphous silicon and the insulating layer are formed in the same process, which reduces the number of processes and saves the manufacturing time and costs.

BRIEF DESCRIPTION OF THE DRAWINGS

In order to more clearly illustrate the technical solution in the embodiments of the present disclosure, the accompanying drawings to be used in the description of the embodiments are briefly described below. It will be apparent that the accompanying drawings in the following description are merely embodiments of the present disclosure, and other accompanying drawings may be obtained without creative work for those skilled in the art.

DETAILED DESCRIPTION

Figure 1:
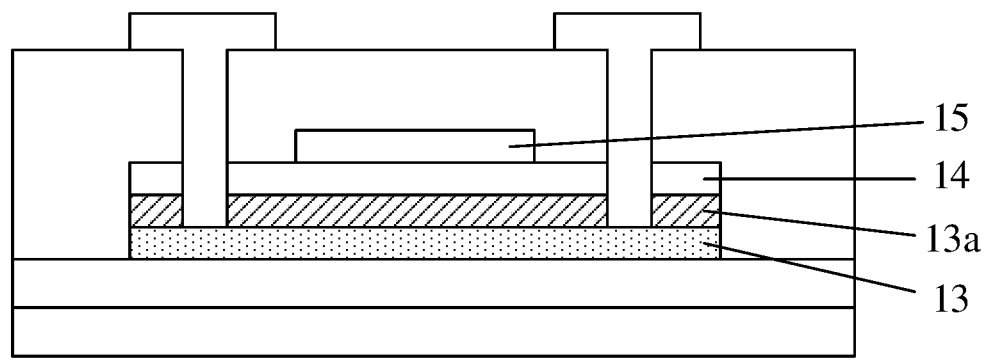
FIG. 1 is a schematic diagram of the structure of an array substrate in the prior art.

The following will clearly and completely describe the technical solutions in the embodiments of the present disclosure with reference to the accompanying drawings in the embodiments of the present disclosure. It is to be understood that the specific embodiments described herein are only used to explain the present disclosure and are not intended to limit the present disclosure. It should also be noted that for ease of description, only part but not all of the structures related to the present disclosure are shown in the drawings. All other embodiments obtained based on the embodiments of the present disclosure by those skilled in the art without making creative efforts shall fall within the protection scope of the present disclosure.

The terms "first", "second", and the like in the present disclosure are used to distinguish different objects and are not used to describe a specific sequence. Furthermore, the terms "include" and "have" and any variants thereof are intended to cover non-exclusive inclusions. For example, a process, method, system, product, or device that includes a series of blocks or units is not limited to the listed blocks or units, but may optionally include blocks or units that are not listed, or may optionally further include other blocks or units inherent to these processes, methods, products, or devices.

An "embodiment" mentioned herein means that a particular feature, structure, or characteristic described with reference to the embodiment can be included in at least one embodiment of the present disclosure. The appearance of the word in various places in the specification is not necessarily all referring to the same embodiment, nor is an independent or alternative embodiment that is mutually exclusive with other embodiments. It will be understood by those skilled in the art, both explicitly and implicitly, that the embodiments described herein can be combined with other embodiments.

Referring to FIG. 1, a schematic diagram of the structure of an array substrate in the prior art is depicted.

Taking a top-gate type array substrate in the prior art as an example, the top-gate array substrate includes a polysilicon layer 13, an insulating layer 14, and a gate electrode 15 which are disposed in a stacked manner.

Since in the process of fabricating the polysilicon layer 13, a layer of amorphous silicon is generally deposited first, and a polysilicon layer 13 is formed after the amorphous silicon layer is processed. Before the insulating layer 14 is formed, the polysilicon layer 13 is exposed to air, and the surface of the polysilicon layer 13 is oxidized in the air to form a thin (about 5 nm) impurity layer 13a. The impurity layer 13a generally includes $SiO_x$ which has many defects. The impurity layer 13a is between the polysilicon layer 13 and the insulating layer 14, which will catch carriers and change the concentration of the current carriers when a TFT is in operation, and the performance of the TFT is largely affected.

Figure 2:
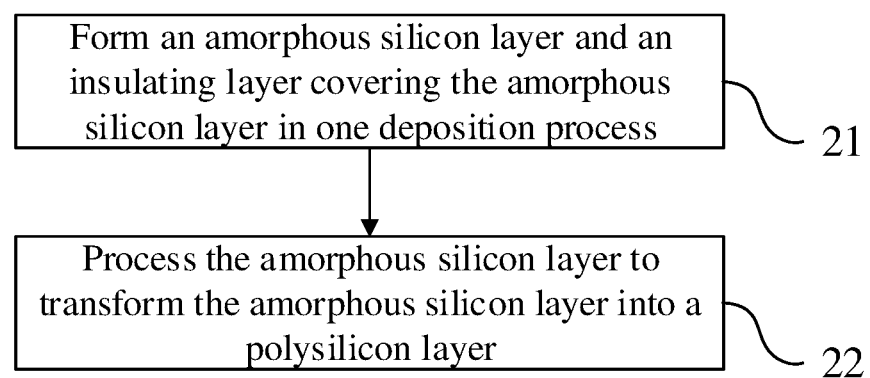
FIG. 2 is a flow chart of a method for manufacturing an array substrate according to an embodiment of the present disclosure.

Referring to FIG. 2, a flow chart of a method for manufacturing an array substrate according to an embodiment of the present disclosure is depicted. The method may include the following blocks.

At block 21: forming an amorphous silicon layer and an insulating layer covering the amorphous silicon layer in one deposition process.

Amorphous silicon is a form of elemental silicon with brownish black or grayish black microcrystals, and does not have complete diamond cells while does not have high purity. Its melting point, density and hardness are also significantly lower than crystalline silicon. Its chemical property is more active than crystalline silicon, and it can be produced by reducing silicon tetrahalide through heating an active metal (e.g., sodium or potassium), or by reducing silica with a reducing agent such as carbon. An amorphous silicon thin film which contains hydrogen can be produced by using the glow discharge vapor deposition method.

The insulating layer may use $SiO_x$, $SiN_x$, or a mixture of $SiO_x$ and $SiN_x$.

It can be understood that the above-mentioned deposition process can be performed by physical vapor deposition (PVD) or chemical vapor deposition (CVD), for example, gas evaporation.

At block 22: processing the amorphous silicon layer to transform the amorphous silicon layer into a polysilicon layer.

Optionally, in this embodiment, excimer laser annealing (ELA) technology is mainly used to transform amorphous silicon into polysilicon.

The temperature at which using ELA to prepare p-Si material is usually below 450° C., and ordinary TFT glass can be used. The p-Si material obtained by this method completely meets the performance requirements of pixel TFT switching devices and peripheral driving TFT devices. Because an XeCl (hafnium chloride) excimer laser apparatus has good gas stability and the a-Si film has a high absorption coefficient (approximately 106 cm$^{-1}$) at a wavelength of 308 nm, the XeCl excimer laser apparatus is generally used for production. The a-Si film was initially annealed by using a spotted laser beam, which is very slow and the obtained p-Si material has many defects. If the laser beam is changed into the laser line, the laser scanning process will become simpler.

Figure 3:
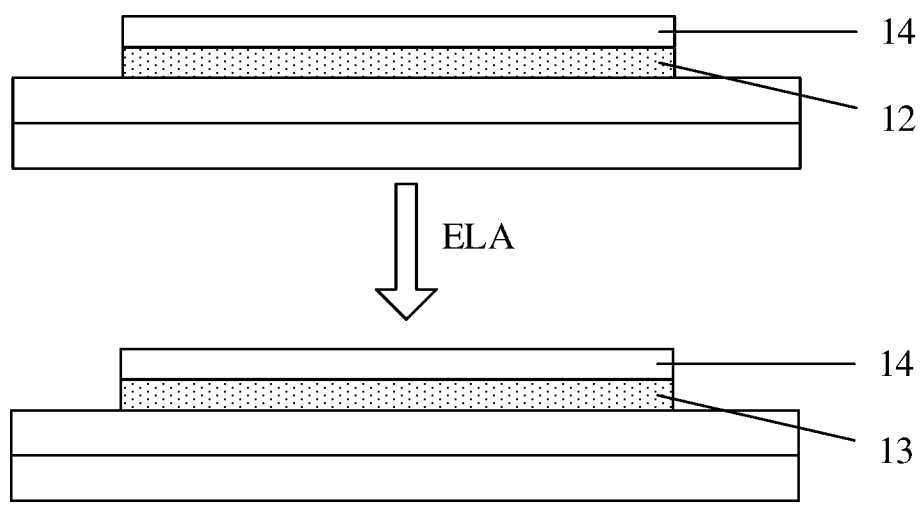
FIG. 3 is a schematic diagram of the structure manufactured by block 22 of the method for manufacturing the array substrate according to the embodiment of the present disclosure.

Referring to FIG. 3, a schematic diagram of the structure manufactured by block 22 of the method for manufacturing the array substrate according to the embodiment of the present disclosure is depicted. An amorphous silicon layer 12 and the insulating layer 14 covering the amorphous silicon layer 12 are formed in one deposition process first, and then the amorphous silicon layer 12 is subjected to an excimer laser annealing process to transform the amorphous silicon layer 12 into the polysilicon layer 13.

Different from the prior art, the method for manufacturing the array substrate in this embodiment includes: forming an amorphous silicon layer and an insulating layer covering the amorphous silicon layer in one deposition process; and processing the amorphous silicon layer to transform the amorphous silicon layer into a polysilicon layer. By means of the above-mentioned methods, on the one hand, the problem that the polysilicon is exposed to air and oxidized after the amorphous silicon is transformed into the polysilicon is avoided, which solves the problem of affecting the concentration of current carriers that caused by the oxidation of the surface of polysilicon, and improves the performance of the array substrate. On the other hand, the amorphous silicon and the insulating layer are formed in the same process, which reduces the number of processes and saves the manufacturing time and costs.

Figure 4:
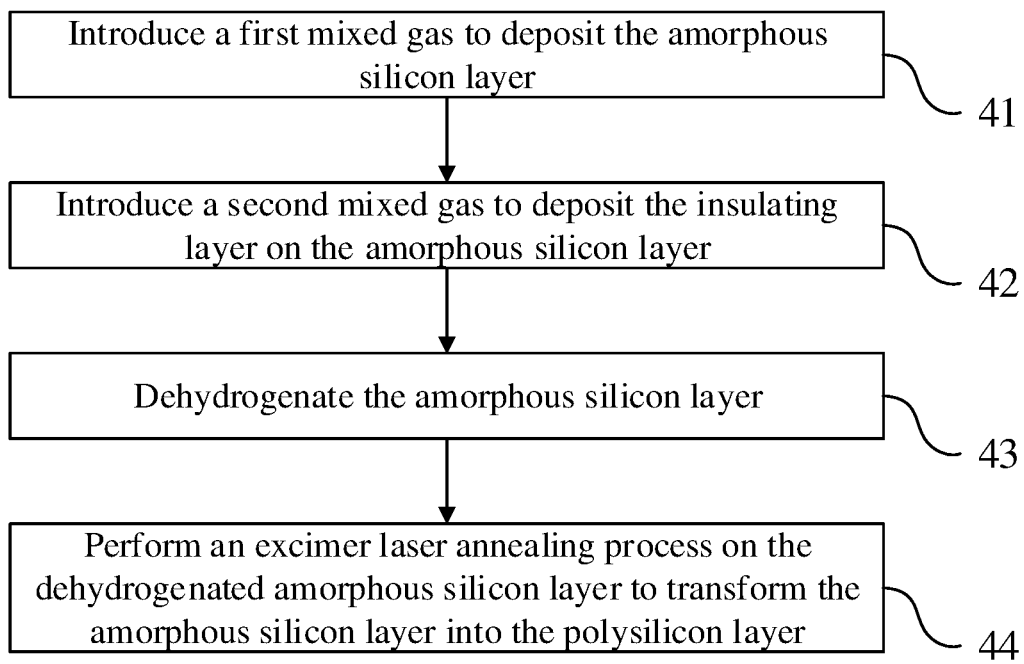
FIG. 4 is a flow chart of a method for manufacturing an array substrate according to another embodiment of the present disclosure.

Referring to FIG. 4, a flow chart of a method for manufacturing an array substrate according to an embodiment of the present disclosure is depicted. The method may include the following blocks.

At block 41: introducing a first mixed gas to deposit the amorphous silicon layer.

At block 42: introducing a second mixed gas to deposit the insulating layer on the amorphous silicon layer.

The insulating layer may be $SiN_x$. Specifically, the first mixed gas may be a mixed gas of $SiH_4$ and $H_2$, and the second mixed gas may be a mixed gas of $SiH_4$ and $NH_3$.

Specifically, a-Si and $SiN_x$ can be deposited at one time by using CVD technology, that is, two blocks are used in a CVD process. The gas in the first block is $SiH_4+H_2$, and the second block is to replace the gas with $SiH_4+NH_3$. Consequently, a-Si and $SiN_x$ can be formed by using CVD technology once.

At block 43: dehydrogenating the amorphous silicon layer.

At block 44: performing an excimer laser annealing process on the dehydrogenated amorphous silicon layer to transform the amorphous silicon layer into the polysilicon layer.

Specifically, a-Si is transformed into p-Si by ELA after performing a dehydrogenation process on a-Si, while $SiN_x$ has been formed and will not be affected. A p-Si polysilicon layer and a gate insulating layer $SiN_x$ are formed by using CVD method once.

In the following, a top-gate TFT is used as an example to describe its manufacturing method in detail.

Figure 5:
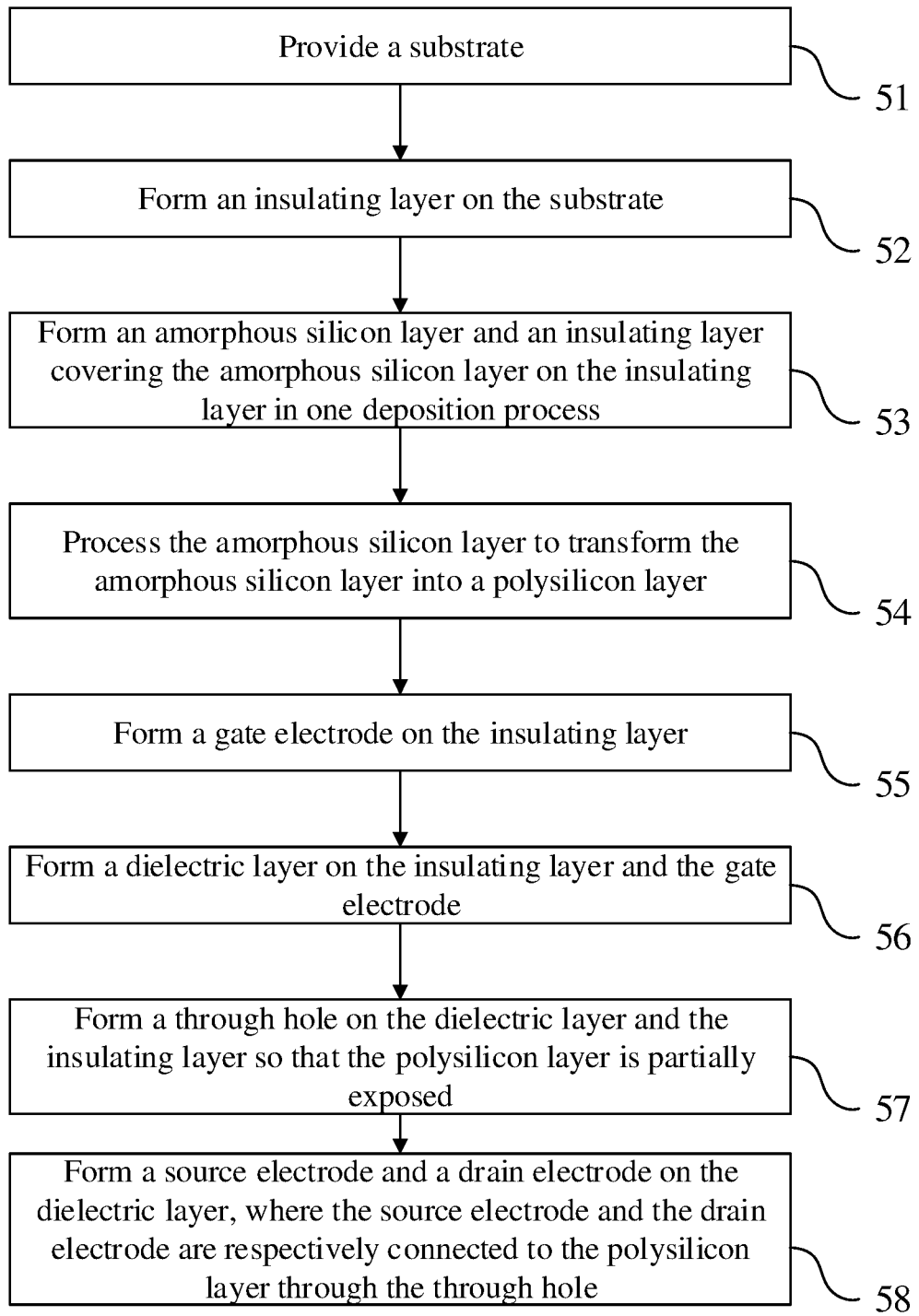
FIG. 5 is a flow chart of a method for manufacturing an array substrate according to still another embodiment of the present disclosure.

Referring to FIG. 5, a flow chart of a method for manufacturing an array substrate according to still another embodiment of the present disclosure is depicted. The method may include the following blocks.

At block 51: providing a substrate.

The substrate may be a glass substrate or a plastic substrate. It can be understood that the substrate is only used as a substrate during the manufacturing process, and the substrate is peeled off after the array substrate is manufactured.

It can be understood that PVD or CVD can be used in the production of each functional layer described below, for example, gas evaporation. If the formed functional layer needs a corresponding patterning process, photolithography, development, etching, peeling, and the like may be used, which will not be described below.

At block 52: forming an insulating layer on the substrate.

The insulating layer may be $SiO_x$, $SiN_x$ or a mixture of $SiO_x$ and $SiN_x$.

At block 53: forming an amorphous silicon layer and an insulating layer covering the amorphous silicon layer on the insulating layer in one deposition process.

Figure 6:
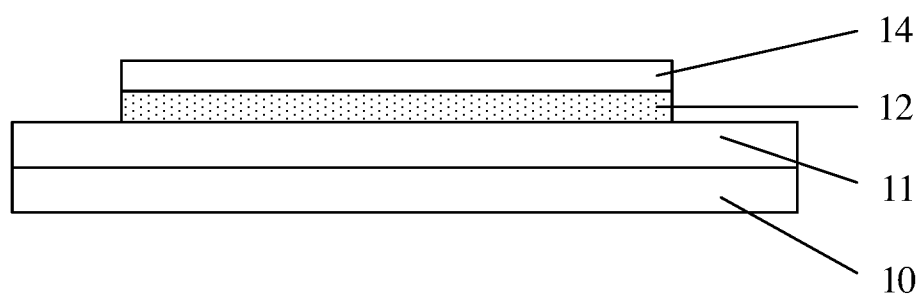
FIG. 6 is a schematic diagram of the structure manufactured by blocks 51-53 of the method for manufacturing the array substrate according to the still another embodiment of the present disclosure.

Referring to FIG. 6, a schematic diagram of the structure manufactured by blocks 51-53 of the method for manufacturing the array substrate according to the still another embodiment of the present disclosure is depicted. As shown in FIG. 6, a substrate 10 is provided, a buffer layer 11 is formed on the substrate 10, and an amorphous silicon layer 12 and an insulating layer 14 covering the amorphous silicon layer 12 are formed on the buffer layer 11 in one deposition process.

Specifically, a-Si and $SiN_x$ can be deposited at one time by using CVD technology. That is, two blocks are used in a CVD process. The gas in the first block is $SiH_4+H_2$, and the second block is to replace the gas with $SiH_4+NH_3$. Consequently, a-Si and $SiN_x$ can be formed by using CVD technology once.

At block 54: processing the amorphous silicon layer to transform the amorphous silicon layer into a polysilicon layer.

Figure 7:
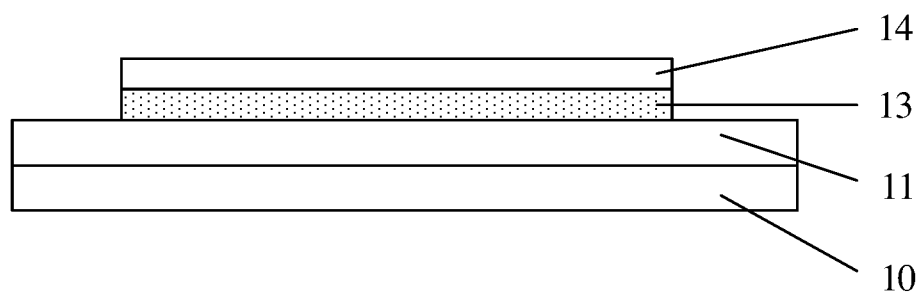
FIG. 7 is a schematic diagram of the structure manufactured by block 54 of the method for manufacturing the array substrate according to the still another embodiment of the present disclosure.

Referring to FIG. 6 and FIG. 7 simultaneously, FIG. 7 is a schematic diagram of the structure manufactured by block 54 of the method for manufacturing the array substrate according to the still another embodiment of the present disclosure. The amorphous silicon layer 12 is processed so that the amorphous silicon layer 12 becomes a polysilicon layer 13.

Specifically, a-Si is transformed into p-Si by ELA after performing a dehydrogenation process on a-Si, while $SiN_x$ has been formed and will not be affected. A p-Si polysilicon layer and a gate insulating layer $SiN_x$ are formed by using CVD method once.

At block 55: forming a gate electrode on the insulating layer.

At block 56: forming a dielectric layer on the insulating layer and the gate electrode.

At block 57: forming a through hole on the dielectric layer and the insulating layer so that the polysilicon layer is partially exposed.

Figure 8:
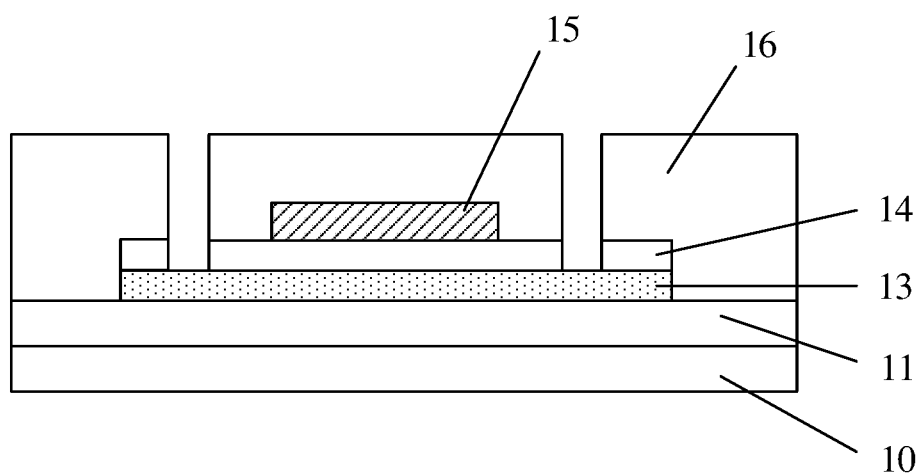
FIG. 8 is a schematic diagram of the structure manufactured by blocks 55-57 of the method for manufacturing the array substrate according to the still another embodiment of the present disclosure.

Referring to FIG. 8, a schematic diagram of the structure manufactured by blocks 55-57 of the method for manufacturing the array substrate according to the still another embodiment of the present disclosure is depicted. A gate electrode 15 is formed on the insulating layer 14, a dielectric layer 16 is formed on the insulating layer 14 and the gate electrode 15, and a through hole is formed on the dielectric layer 16 and the insulating layer 14 so that the polysilicon layer 13 is partially exposed.

It can be understood that the gate electrode 15 may be formed by depositing a conductive layer first, and then forming the gate electrode 15 through a patterning process. Therefore, the gate electrode 15 does not completely cover the insulating layer 14. Hence, when forming the trough hole on the dielectric layer 16 and the insulating layer 14. The trough hole is formed at a position where the gate electrode 15 is not covered, and the through hole will not contact with the gate electrode 15.

The gate electrode 15 is composed of metal Mo, and the dielectric layer 16 composes of $SiO_x$, $SiN_x$ or a mixture of $SiO_x$ and $SiN_x$.

At block 58: forming a source electrode and a drain electrode on the dielectric layer, where the source electrode and the drain electrode are respectively connected to the polysilicon layer through the through hole.

Figure 9:
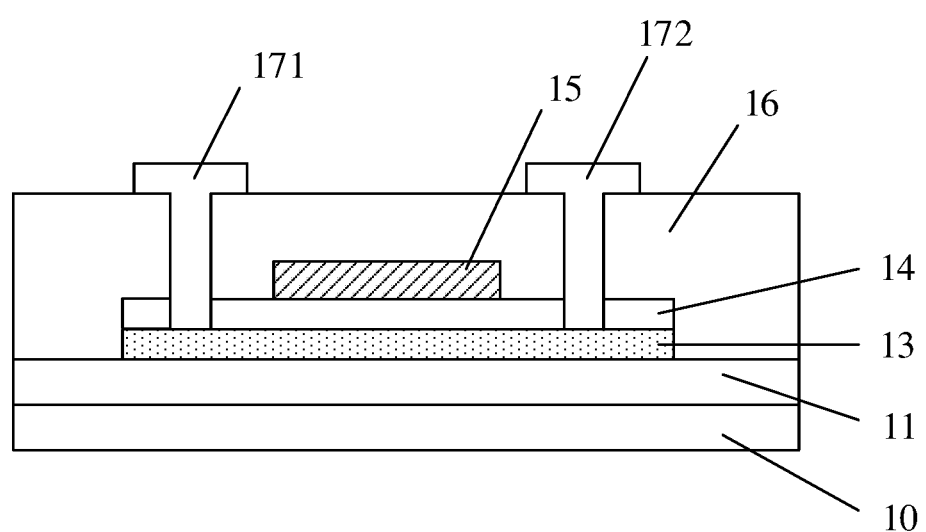
FIG. 9 is a schematic diagram of the structure manufactured by block 58 of the method for manufacturing the array substrate according to the still another embodiment of the present disclosure.

Referring to FIG. 9, a schematic diagram of the structure manufactured by block 58 of the method for manufacturing the array substrate according to the still another embodiment of the present disclosure is depicted. A source electrode 171 and a drain electrode 172 are formed on the dielectric layer 16, and the source electrode 171 and the drain electrode 172 are respectively connected to the polysilicon layer 13 through the through hole.

The source electrode 171 and the drain electrode 172 are composed of metal Ti, metal Al, and metal Ti which are disposed in a stacked manner.

It can be understood that the array substrate in this embodiment may also be a bottom-gate type array substrate, that is, the layers on the substrate 10 are sequentially stacked in the following order: the buffer layer 11, the gate electrode 15, the gate insulating layer 14, the polysilicon layer 13, and the dielectric layer 16, and the source electrode 171 and the drain electrode 172 are respectively connected to the polysilicon layer 13 through the through hole formed on the dielectric layer 16 and the insulating layer 14.

Figure 10:
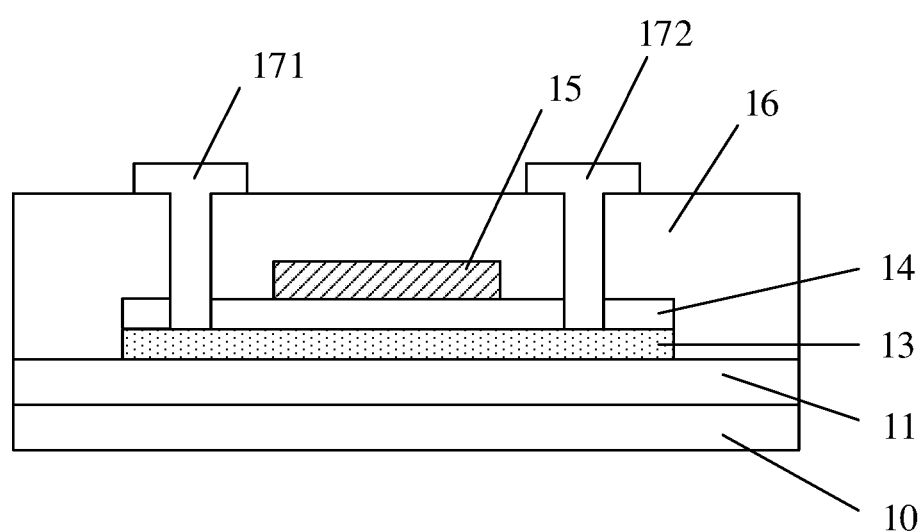
FIG. 10 is a schematic diagram of the structure of an array substrate according to an embodiment of the present disclosure.

Referring to FIG. 10, a schematic diagram of the structure of an array substrate according to an embodiment of the present disclosure is depicted. The array substrate includes a substrate 10, a buffer layer 11, a polysilicon layer 13, an insulating layer 14, a gate 15, a dielectric layer 16, a source electrode 171 and a drain electrode 172 which are disposed in a stacked manner. In which, the source electrode 171 and the drain electrode 172 are respectively connected to the polysilicon layer 13 through the through hole formed on the dielectric layer 16 and the insulating layer 14.

The method for manufacturing the polysilicon layer 13 and the insulating layer 14 is as follows: forming an amorphous silicon layer and an insulating layer covering the amorphous silicon layer on the insulating layer in one deposition process; and processing the amorphous silicon layer to transform the amorphous silicon layer into a polysilicon layer.

Specifically, a-Si and $SiN_x$ can be deposited at one time by using CVD technology. That is, two blocks are used in a CVD process. The gas in the first block is $SiH_4+H_2$, and the second block is to replace the gas with $SiH_4+NH_3$. Consequently, a-Si and $SiN_x$ can be formed by using CVD technology once. a-Si is transformed into p-Si by ELA (excimer laser annealing) after performing a dehydrogenation process on a-Si, while $SiN_x$ has been formed and will not be affected. A p-Si polysilicon layer and a gate insulating layer $SiN_x$ are formed by using CVD method once.

It can be understood that the array substrate of this embodiment can be manufactured using the manufacturing method provided in the above-mentioned embodiments, which will not be described here.

Figure 11:
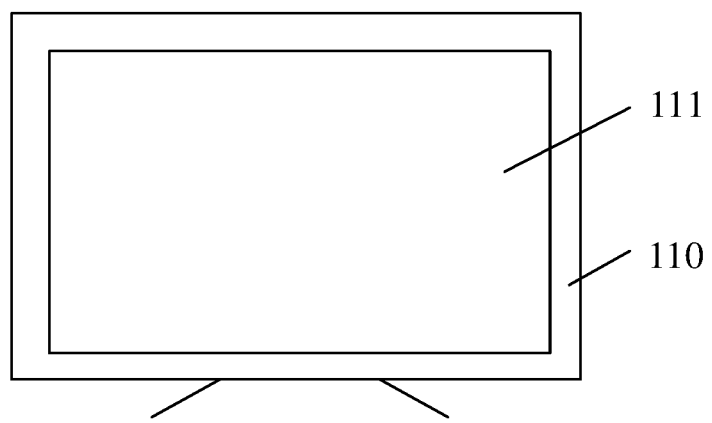
FIG. 11 is a schematic diagram of the structure of a display device according to an embodiment of the present disclosure.

Referring to FIG. 11, a schematic diagram of the structure of a display device according to an embodiment of the present disclosure is depicted. The display device 110 includes a display panel 111. The display panel 111 includes an array substrate.

The display panel 111 may be a liquid crystal panel or an OLED panel, that is, the array substrate provided by the above-mentioned embodiments may be applied to a liquid crystal panel or an OLED panel.

Also referring to FIG. 10, if the display panel 111 is applied to a liquid crystal panel, a flat layer may be further disposed on the source electrode 171, the drain electrode 172, and the dielectric layer 16. A common electrode is disposed on the flat layer, and the common electrode connects the source electrode 171 or the drain electrode 172 through a through hole on the flat layer. In addition, the liquid crystal panel further includes a color filter substrate disposed opposite to the array substrate, the color filter substrate may include a color filter and a pixel electrode, and the array substrate and the color filter substrate form the liquid crystal panel after a pair box process.

Also referring to FIG. 10, if the display panel 111 is applied to an OLED panel, a flat layer may be further disposed on the source electrode 171, the drain electrode 172, and the dielectric layer 16, and an anode, an OLED light emitting material, a cathode, and an encapsulation layer may be sequentially stacked on the flat layer. In which, the anode is connected to the source 171 electrode or the drain electrode 172 through a through hole on the flat layer.

Different from the prior art, when making the polysilicon layer in the array substrate and the display device using the array substrate provided in this embodiment, the amorphous silicon layer and the insulating layer covering the amorphous silicon layer are formed in one deposition process; and then the amorphous silicon layer is processed to transform the amorphous silicon layer into a polysilicon layer. On the one hand, the problem that the polysilicon is exposed to air and oxidized after the amorphous silicon is transformed into the polysilicon is avoided, which solves the problem of affecting the concentration of current carriers that caused by the oxidation of the surface of polysilicon, and improves the performance of the array substrate. On the other hand, the amorphous silicon and the insulating layer are formed in the same process, which reduces the number of processes and saves the manufacturing time and it is beneficial to reduce the manufacturing cost of the display device.

The foregoing descriptions are merely implementation manners of the present disclosure, while do not limit the scope of the present disclosure. Any equivalent structure or equivalent process change using the description of the present disclosure and the accompanying drawings, and direct or indirect applications in other related technical fields, are all within the protection scope of the present disclosure.

What is claimed is:

1. A method for manufacturing a display device, comprising
providing an array substrate comprising a polysilicon layer and insulating layer being disposed in a stacked manner;
introducing a first mixed gas to deposit an amorphous silicon layer;
introducing a second mixed gas to deposit the insulating layer on the amorphous silicon layer, wherein the insulating layer covers the amorphous silicon layer, the second mixed gas is a mixed gas of $SiH_4$ and $NH_3$;
dehydrogenating the amorphous silicon layer; and
performing an excimer laser annealing process on the dehydrogenated amorphous silicon layer to transform the amorphous silicon layer into the polysilicon layer while the insulating layer is covering the amorphous silicon layer;
wherein, an amorphous silicon layer and an insulating layer covering the amorphous silicon layer are formed during performing one same process of chemical vapor deposition (CVD), the polysilicon layer has a first side face and a second side face, the insulating layer has a third side face and a fourth side face, the first side face is flushed with the third side face, and the second side face is flushed with the fourth side face.

2. The device of claim 1, wherein the first mixed gas is a mixed gas of $SiH_4$ and $H_2$.

3. The device of claim 1, wherein the array substrate further comprises a substrate and buffer layer being disposed in a stacked manner, and the polysilicon layer is disposed on the buffer layer.

4. The device of claim 3, wherein the array substrate further comprises a gate electrode formed on the insulating layer, a dielectric layer formed on the insulating layer and the gate electrode, and a source electrode and a drain electrode formed on the dielectric layer; wherein the source electrode and the drain electrode are respectively connected to the polysilicon layer through a through hole formed on the dielectric layer and the insulating layer.

5. The device of claim 4, wherein:
the gate electrode is made of metal Mo; or
the source electrode and the drain electrode are respectively composed of metal Ti, metal Al, and metal Ti being disposed in a stacked manner.

6. A method for manufacturing an array substrate, comprising:
forming an amorphous silicon layer and an insulating layer covering the amorphous silicon layer during performing one same process of CVD, wherein the insulating layer covers the amorphous silicon layer; and
processing the amorphous silicon layer to transform the amorphous silicon layer into a polysilicon layer while the insulating layer is covering the amorphous silicon layer wherein the polysilicon layer has a first side face and a second side face, the insulating layer has a third side face and a fourth side face, the first side face is flushed with the third side face, and the second side face is flushed with the fourth side face;

wherein the forming the amorphous silicon layer and the insulating layer covering the amorphous silicon layer comprises:

introducing a first mixed gas to deposit the amorphous silicon layer; and introducing a second mixed gas to deposit the insulating layer on the amorphous silicon layer, wherein the second mixed gas is a mixed gas of $SiH_4$ and $NH_3$.

7. The method of claim 6, wherein the first mixed gas is a mixed gas of $SiH_4$ and $H_2$.

8. The method of claim 6, wherein the processing the amorphous silicon layer to transform the amorphous silicon layer into the polysilicon layer comprises:

dehydrogenating the amorphous silicon layer; and performing an excimer laser annealing process on the dehydrogenated amorphous silicon layer to transform the amorphous silicon layer into the polysilicon layer.

9. The method of claim 6, before the forming the amorphous silicon layer and the insulating layer covering the amorphous silicon layer in one deposition process further comprising:

providing a substrate; and forming a buffer layer on the substrate;

the forming the amorphous silicon layer and the insulating layer covering the amorphous silicon layer in one deposition process comprises:

forming the amorphous silicon layer and the insulating layer covering the amorphous silicon layer on the buffer layer in one deposition process.

10. The method of claim 9, after the processing the amorphous silicon layer to transform the amorphous silicon layer into the polysilicon layer further comprising:

forming a gate electrode on the insulating layer;

forming a dielectric layer on the insulating layer and the gate electrode;

forming a through hole on the dielectric layer and the insulating layer so that the polysilicon layer is partially exposed; and forming a source electrode and a drain electrode on the dielectric layer, wherein the source electrode and the drain electrode are respectively connected to the polysilicon layer through the through hole.

11. The method of claim 10, wherein:

the gate electrode is made of metal Mo; or the source electrode and the drain electrode are respectively composed of metal Ti, metal Al, and metal Ti being disposed in a stacked manner.

* * * * *